United States Patent [19]

Anderson

[11] Patent Number: 4,931,921
[45] Date of Patent: Jun. 5, 1990

[54] WIDE BANDWIDTH FREQUENCY DOUBLER

[75] Inventor: Dale R. Anderson, Ft. Worth, Tex.
[73] Assignee: Motorola, Inc., Schaumburg, Ill.
[21] Appl. No.: 358,330
[22] Filed: May 30, 1989
[51] Int. Cl.$^5$ .......................................... H02M 5/293
[52] U.S. Cl. .................................. 363/163; 363/157; 328/16; 328/20; 333/218
[58] Field of Search ............... 363/157, 159, 163, 165; 328/15, 16, 20; 333/218, 167, 168, 175, 176; 331/19

[56] References Cited

U.S. PATENT DOCUMENTS

| | | | |
|---|---|---|---|
| 3,230,396 | 1/1966 | Boelke | 363/163 |
| 3,334,293 | 8/1967 | Schultz | 363/173 |
| 3,717,784 | 1/1973 | Heise | 363/163 |
| 4,176,332 | 11/1979 | Bachert | 333/218 |
| 4,206,421 | 6/1980 | Bernhard et al. | 331/19 |

OTHER PUBLICATIONS

Nguyen, "A 35% Bandwidth Q-to-W-Band Frequency Doubler", Microwave Journal, Sep. 1987, pp. 232-235.
Faber et al., "A Frequency Doubler with 35% Efficiency at W Band", Microwave Journal, Jul. 1985, pp. 145-152.

Primary Examiner—Peter S. Wong
Attorney, Agent, or Firm—Joseph P. Krause; Steven G. Parmelee

[57] ABSTRACT

A single-transistor frequency doubler uses an elliptical filter on the collector of the transistor to improve the bandwidth of the doubler. Bandwidths in excess of thirty five percent having relatively constant output power levels at frequencies over 200 MHz can be realized.

8 Claims, 1 Drawing Sheet

WIDE BANDWIDTH FREQUENCY DOUBLER

BACKGROUND OF THE INVENTION

This invention relates to single transistor frequency multiplier circuits. More specifically, this invention relates to single-transistor frequency doublers.

A frequency doubler is a circuit that produces an output signal, (usually a sinusoidal but also possibly including square waves, sawtooth waves, etc.) at twice the frequency of an input signal. Input signal is suppressed from the output.

Ideally, a frequency doubler can double any input frequency, $f_{in}$, but in reality has a bandwidth defined as the difference between the range of permissible input frequencies, i.e., $f_0-f_1$ divided by $f_1$, (where $f_1$ is the highest input frequency that the doubler can accept and $f_0$ is the lowest frequency the doubler accepts). For a range of input frequencies $f_{in}=f_0$ to $f_1$, as $f_1$ gets larger, it eventually equals the value of $2f_0$, the doubled, lower input frequency $f_0$. Input signals ($f_{in}$) in the range beyond $f_0-f_1$ cannot be doubled by the circuit because the circuit cannot double $f_0$ to produce $2f_0$ signals, yet suppress from the output, $f_1$ input signals nearly equal to $2f_0$.

The mathematical limit of the bandwidth of a frequency doubler is fifty percent. For example, a frequency doubler capable of accepting an input frequency between 100 and 150 MHz that produces an output frequency between 200 and 300 MHz, has a bandwidth of 33%. A frequency doubler with an input frequency between 100 and 200 MHz and an output frequency of 200 to 400 MHz has a bandwidth of 50% where $2f_0$ equals $f_1$. In reality because of physical limitations of circuit components, prior art single transistor doublers typically have bandwidths around fifteen percent.

Prior art single transistor doublers typically have narrow bandwidths because of the characteristics of traps and filters used to suppress undesired frequencies at the output of the doubler. A single transistor frequency doubler typically consists of a base circuit trap resonant at $2f_{in}$ and a combination of collector circuit traps and filters designed to suppress $f_{in}$ signal yet pass $2f_{in}$ signals. To suppress $f_{in}$ signals from the output prior art traps and filters substantially limit the bandwidth of frequency doublers.

Increasing the bandwidth of a frequency doubler can usually be had only at the expense of additional transistor stages or additional passive circuitry in the base or collector circuits adding to parts count and signal losses and also increasing the complexity of the circuit. A frequency doubler having a wider bandwidth without substantially increasing the parts count would improve the performance and reduce the cost of a radio requiring these types of circuits.

SUMMARY OF THE INVENTION

There is herein provided a frequency multiplier circuit having a relatively wide bandwidth using a single transistor with an elliptical filter. The elliptical filter, well known to those skilled in the art, is designed to have a low input impedance at the fundamental frequency of an input signal ($f_{in}$) while having a relatively high input impedance at the pass band range of the circuit ($2f_{in}$). The driving signal and the DC bias of the transistor are chosen to permit operation of the transistor in its non-linear region whereby harmonics are produced in the collector current. Using the elliptical filter with a single transistor permits the frequency doubler to have badwidths in excess of 35% with relatively constant output power across the entire operating frequency range of the circuit.

DETAILED DESCRIPTION OF THE PREFERRED EMBODIMENT

Figure 1:
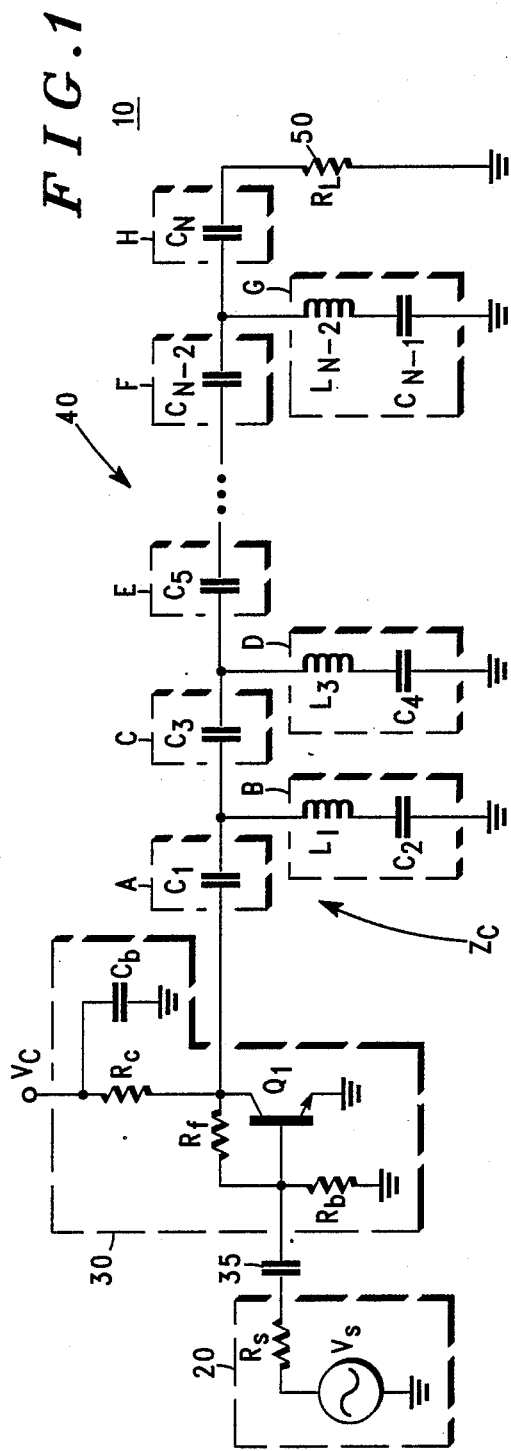
FIG. 1 shows a schematic diagram of the frequency doubler of the present invention.

In FIG. 1 there is shown a wide band frequency doubler (10) comprised of a signal generator (20) coupled to a single transistor amplifier stage (30) by means of a capacitor (35). The collector circuit of the amplifier (30) is coupled to an elliptical filter (40) which is in turn coupled to a load (50) as shown. By appropriate selection of component values in the elliptical filter (40), the circuit of FIG. 1 can provide a broad-band frequency doubler having a bandwidth in excess of 35% with a relatively constant power level across the doubled frequency range at the load resistor $R_L$.

The signal generator (20) is a voltage source (Vs) in series with an output impedance ($R_S$). It provides an input sinusoidal voltage to the amplifier stage (30) by means of the coupling capacitor (35) which blocks D.C.. The voltage of the input signal source (20) and the D.C. bias of the transistor (Q1) are chosen such that the transistor (Q1) is driven in its non-linear region.

Since the collector current of the transistor (Q1) is approximated by the relationship:

$$I_c = I_{ES}[e^{gV_{bc}Q/KT} - 1]$$

where $I_c$ is the collector current;

$I_{ES}$ is the base-emitter saturation current;

g is a constant approximately equal to 1 for silicon transistors;

$V_{be}$ is the transistor's base-emitter voltage;

Q is the electronic charge;

K is Boltzman's constant; and

T is the temperature in degrees Kelvin;

the collector current of the transistor will inherently contain harmonics of a signal input to the base of the transistor. Rf and Rb in combination with the value of $R_C$ establish the bias point of the transistor (Q1). The capacitor $C_b$ in the collector circuit shorts A.C. signals to ground to keep radio frequency signals out of the power supply. In the preferred embodiment, $R_c$ is 300 ohms; $R_f$ and $R_b$ are 6.8 k-ohms and 1 k-ohms respectively. $C_b$ and $C_{35}$ are both 0.01 microfarad capacitors.

The transfer function of the elliptical filter (40) is characterized by a stop band that is described by elliptical functions. The elliptical filter used in the preferred embodiment is a five pole, high-pass filter having a low impedance over the entire range of input frequencies, $f_0-f_1$ reducing the magnitude of input frequencies ($f_{in}$) present at the output. At second harmonic frequencies ($2f_{in}$), the filter has a high impedance. The reactive elements are chosen so as to present a nearly resistive load to the amplifier (30) at the second harmonic frequencies.

The elliptical filter (40) of the preferred embodiment is comprised of five cascaded stages (A through E). Each stage of the filter is an element in either a series arm or in a shunt arm. The first stage of the elliptical filter (40), element A, is comprised of a capacitor ($C_1$). The second stage of the filter, element B, is comprised of inductor $L_1$ in series with capacitor $C_2$. Successive stages of the filter shown in FIG. 1 are identified as elements C through H.

Cascading additional stages in the elliptical filter (40) improves the bandwidth of the frequency doubler by increasing the attenuation of signals outside of the pass band region. Adding additional stages, however, to the elliptical filter increases parts count and causes additional signal losses. In the preferred embodiment, the elliptical filter (40) comprises a five-pole elliptical filter and produces a bandwidth of 35% when the input frequency operates between 210 and 325 MHz. While the preferred embodiment acts as a frequency doubler, by appropriate selection of pass-band frequencies the circuit disclosed herein could act as a frequency multiplier that multiplies input frequencies by other factors. The pass-band of the elliptical filter could be at other harmonics, such as third or fourth harmonics.

Figure 2:
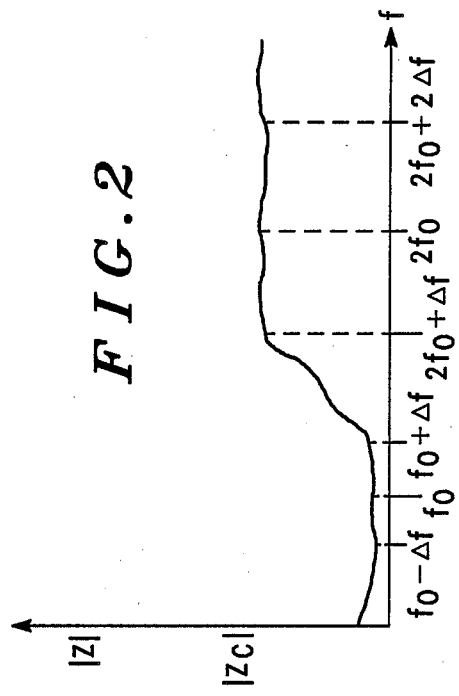
FIG. 2 shows a plot of the input impedance of the elliptical filter used in the circuit of FIG. 1 over a frequency range of operation expected in a doubler.

In the preferred embodiment, the transistor Q1 is a Motorola MRF8372. $C_1$ is 27 pF; $L_1$ is 15 nH; $C_2$ is 43 pF; $C_3$ is 4.3 pF; $L_3$ is 20 nH; $C_4$ is 15 pF and $C_5$ is 15 pF. A plot of the magnitude of the input impedance of the elliptical filter (40) of FIG. 1 using the values of the preferred embodiment is shown in FIG. 2. (It should be noted that at the operation frequencies of the preferred embodiment, distributed reactances, such as stray capacitance and lead-length inductance, affect the operation of the circuit.)

From FIG. 2 it can be seen that at frequencies around the fundamental frequency ($f_0$) the input impedance of the filter is relatively low. At frequencies around the desired output frequency $2f_0$, the input impedance of the elliptical filter is relatively high. The combination of a low, wide-band collector impedance at $f_0$, as provided by the elliptical filter, and an almost constant and relatively high $2f_0$ impedance, produces a frequency doubler with a substantially flat conversion gain over a relatively wide band-width. Output power from the circuit of FIG. 1 is relatively constant across the entire doubled frequency bandwidth.

What is claimed is:

1. A frequency multiplier comprised of:
   signal amplification means, having an input and an output, for amplifying an input signal and producing an output signal having harmonic frequency multiples of said input signal;
   first elliptical filter means having a relatively low input impedance at the frequency of said input to said signal amplification means and a relatively high input impedance at a pass-band frequency range, said first elliptical filter means coupled to said output of said signal amplification means for attenuating electrical signals outside of said pass-band frequency range while substantially passing signals within said pass-band frequency range, said first elliptical filter means passing signals at frequency multiples of said signal input to the amplification means.

2. The frequency multiplier of claim 1 where said signal amplification means includes a transistor.

3. The frequency multiplier of claim 1 where said transistor is driven non-linearly.

4. The frequency multiplier of claim 1 where said elliptical filter has cascaded filter stages.

5. The frequency multiplier of claim 1 wherein said pass-band range of said first filter is substantially twice the frequency of said input signal.

6. The frequency multiplier of claim 1 wherein said first filter means suppresses, at the output of said signal amplification means, the frequency of said input signal.

7. The frequency multiplier of claim 1 where said first filter means has a low-impedance stop-band bandwidth of at least thirty five percent.

8. The frequency multiplier of claim 1 where said first filter means has a substantially high, flat output impedance in the pass-band range and a substantially lower impedance outside the pass-band.

* * * * *